US012572118B2

(12) United States Patent (10) Patent No.: US 12,572,118 B2
Herbsommer et al. (45) Date of Patent: Mar. 10, 2026

(54) COMPACT MILLIMETER WAVE SYSTEM

(71) Applicant: Texas Instruments Incorporated, Dallas, TX (US)

(72) Inventors: Juan Alejandro Herbsommer, Allen, TX (US); Argyrios Dellis, McKinney, TX (US); Adam Joseph Fruehling, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/332,789

(22) Filed: Jun. 12, 2023

(65) Prior Publication Data

US 2023/0333514 A1 Oct. 19, 2023

Related U.S. Application Data

(60) Division of application No. 17/527,246, filed on Nov. 16, 2021, now Pat. No. 11,675,316, which is a continuation of application No. 17/020,877, filed on Sep. 15, 2020, now Pat. No. 11,204,588, which is a continuation of application No. 16/400,010, filed on Apr. 30, 2019, now Pat. No. 10,809,668.

(60) Provisional application No. 62/669,598, filed on May 10, 2018.

(51) Int. Cl.
*G04F 5/14* (2006.01)
*H03L 7/26* (2006.01)
*H04B 1/40* (2015.01)
(52) U.S. Cl.
CPC .................. *G04F 5/14* (2013.01); *H03L 7/26* (2013.01); *H04B 1/40* (2013.01)

(58) Field of Classification Search
CPC ....................................................... G04F 5/14
See application file for complete search history.

(56) References Cited

U.S. PATENT DOCUMENTS

| | | | |
|---|---|---|---|
| 2,702,351 A | 2/1955 | Hershberger | |
| 2,819,450 A | 1/1958 | Townes | |
| 3,165,705 A * | 1/1965 | Dicke ...................... | H03L 7/26 |
| | | | 324/636 |
| 3,482,161 A | 12/1969 | Poulter | |
| 4,034,377 A | 7/1977 | Knox et al. | |
| 5,192,921 A * | 3/1993 | Chantry ................... | H03L 7/26 |
| | | | 331/3 |
| 9,529,334 B2 | 12/2016 | Herbsommer et al. | |

(Continued)

FOREIGN PATENT DOCUMENTS

| | | |
|---|---|---|
| WO | 2014029663 A1 | 2/2014 |
| WO | 2014048799 A2 | 4/2014 |

OTHER PUBLICATIONS

European Patent Office, Office action for Application No. 19799607. 1-1001, dated Sep. 19, 2023, 5 pages.

(Continued)

*Primary Examiner* — Hsinchun Liao
(74) *Attorney, Agent, or Firm* — Zhenhai Fu; Frank D. Cimino

(57) ABSTRACT

In some examples, an apparatus comprises a substrate, an interposer mechanically coupled to the substrate, a gas cell on at least part of the interposer, and a plate on the gas cell and mechanically coupled to the interposer. Some examples of the apparatus are configured to be millimeter wave devices.

20 Claims, 14 Drawing Sheets

(56) References Cited

U.S. PATENT DOCUMENTS

| | | | |
|---|---|---|---|
| 9,728,835 | B2 | 8/2017 | Lam et al. |
| 10,131,115 | B1 | 11/2018 | Fruehling et al. |
| 2003/0169134 | A1 | 9/2003 | Ammar et al. |
| 2006/0022761 | A1 | 2/2006 | Abeles et al. |
| 2007/0247241 | A1 | 10/2007 | Braun et al. |
| 2010/0259334 | A1 | 10/2010 | Briggs et al. |
| 2012/0301631 | A1 | 11/2012 | Overstolz et al. |
| 2012/0302095 | A1* | 11/2012 | Shahoian ............. H01R 12/716 |
| | | | 29/842 |
| 2016/0291549 | A1 | 10/2016 | Herbsommer et al. |
| 2017/0146958 | A1 | 5/2017 | Gallinet et al. |
| 2019/0027802 | A1 | 1/2019 | Noori et al. |
| 2019/0071306 | A1 | 3/2019 | Herbsommer et al. |
| 2019/0074233 | A1 | 3/2019 | Fruehling et al. |

OTHER PUBLICATIONS

Notification of Transmittal of the International Search Report and the Written Opinion of the International Searching Authority, or the Declaration; mail date:Aug. 22, 2019: PC/TUS2019/031654; 6 pages.
Extended European Search Report; Application No./Patent No. 19799607.7-1001/ 3971233; PCT/US2019031654; dated Sep. 27, 2021.

* cited by examiner

COMPACT MILLIMETER WAVE SYSTEM

CROSS-REFERENCE TO RELATED APPLICATION

This application is a division of U.S. patent application Ser. No. 17/527,246, filed Nov. 16, 2021, which is a continuation of U.S. patent application Ser. No. 17/020,877, filed Sep. 15, 2020 (now U.S. Pat. No. 11,204,588), which is a continuation of U.S. patent application Ser. No. 16/400, 010, filed Apr. 30, 2019 (now U.S. Pat. No. 10,809,668), which claims priority to and the benefit of U.S. Provisional Patent Application No. 62/669,598, entitled "COMPACT MM-WAVE MOLECULAR CLOCK," filed May 10, 2018, all of which are hereby incorporated herein by reference in their entirety.

BACKGROUND

The example embodiments relate to a precision compact millimeter wave systems (30 GHz to 300 GHz) systems, such as a molecular clock operating based on rotational quantum response in the clock cell.

Precision clock signals, usable as a base frequency source either directly, or converted (e.g., divided down) to some multiple of a base frequency source, can be generated from various circuits and configurations. One precision clock signal example is an atomic clock, so named as its signal is produced in response to the natural and quantum response of atoms or molecules, to an excitation source. In one approach, such atoms are in the form of alkali metals stored in a chamber, where the excitation source can be one or more lasers directed to the cell and the response of the chamber atoms is detected by measuring the amount of laser energy (photons) that passes through the chamber as the laser frequency sweeps across a range. In another approach, such molecules are in the form of dipolar gases also stored in a chamber, where the excitation source is an electromagnetic wave propagating through the chamber and the response of the chamber atoms is detected by measuring the amount of electromagnetic energy that passes through the chamber as the energy source sweeps across a range.

Further to the above, an example of a millimeter wave atomic clock is described in U.S. Pat. No. 9,529,334 ("the '334 Patent"), issued Dec. 27, 2016, hereby incorporated fully herein by reference, and which is co-assigned to the same assignee as the present application. The '334 Patent illustrates, among other things, an atomic clock apparatus including a sealed cavity storing a dipolar gas, with an electromagnetic entrance into which an electromagnetic wave (or field) enters near a first end of the cavity and an electromagnetic exit from which an electromagnetic wave exits near a second end of the cavity. The electromagnetic wave that so exits is measured to determine an amount of absorption by (or transmission through) the dipolar gas, with the measure indicative of the quantum response of the gas as a function of the wave frequency.

Example embodiments are provided herein that build on certain of the above concepts, as further detailed below.

SUMMARY

A millimeter wave apparatus, with a substrate, a transceiver in a first fixed position relative to the substrate, and a gas cell in a second fixed position relative to the substrate. The clock apparatus also comprises at least four waveguides: (i) a first waveguide affixed relative to the substrate, the first waveguide having a first end coupled to the transceiver and a portion, along a first dimension, having a second end proximate a first portion of the gas cell; (ii) a second waveguide affixed relative to the substrate, the second waveguide having a first end coupled to the transceiver and a portion, along a second dimension, having a second end proximate a second portion of the gas cell; (iii) a third waveguide coupled, along a third dimension differing from the first dimension, between the second end of the first waveguide and the first portion of the gas cell; and (iv) a fourth waveguide coupled, along a fourth dimension differing from the second dimension, between the second end of the second waveguide and the second portion of the gas cell.

Other aspects are also disclosed and claimed.

DETAILED DESCRIPTION

Figure 1A:
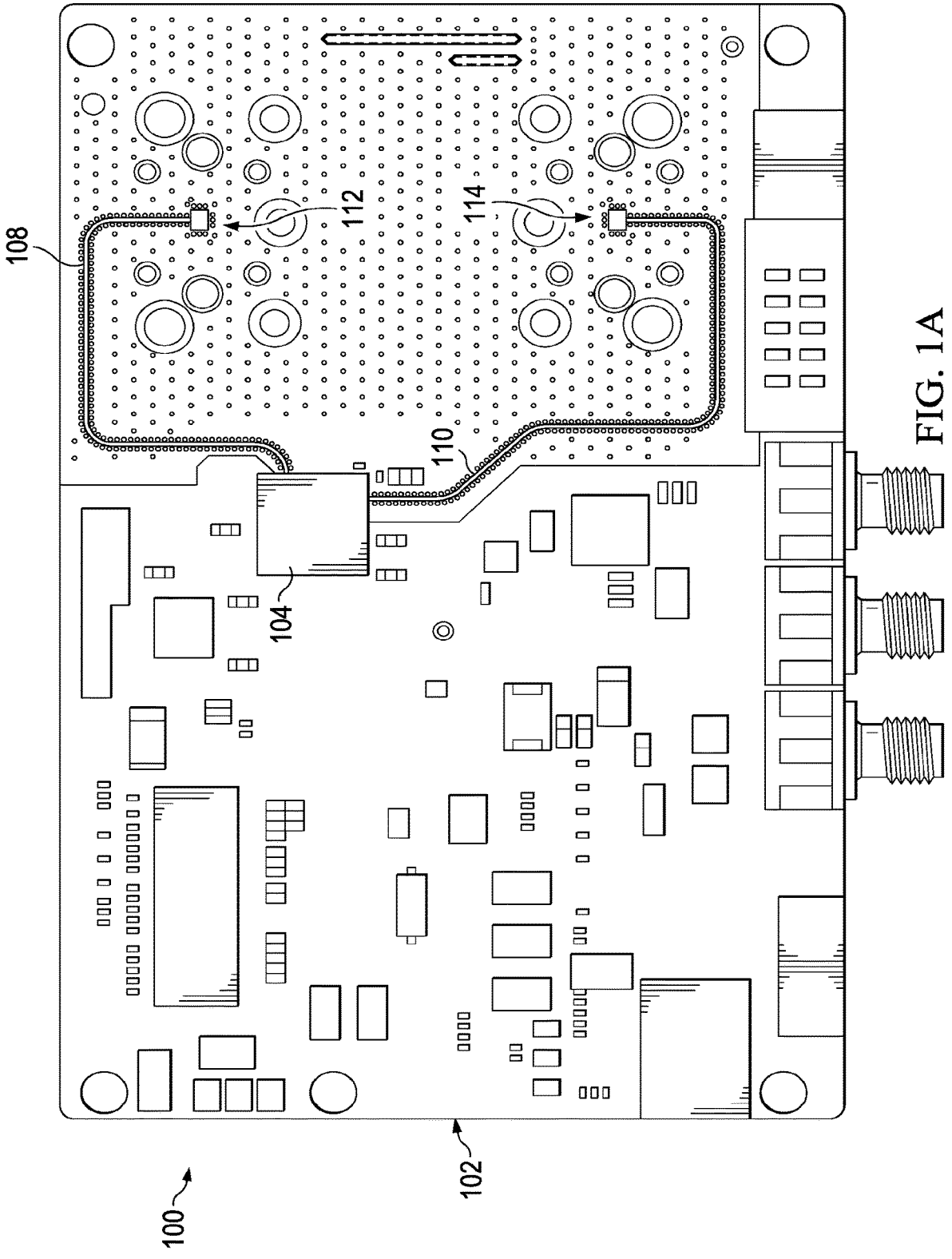
FIG. 1A is a plan view of portions of a compact molecular clock system.
Figure 1B:
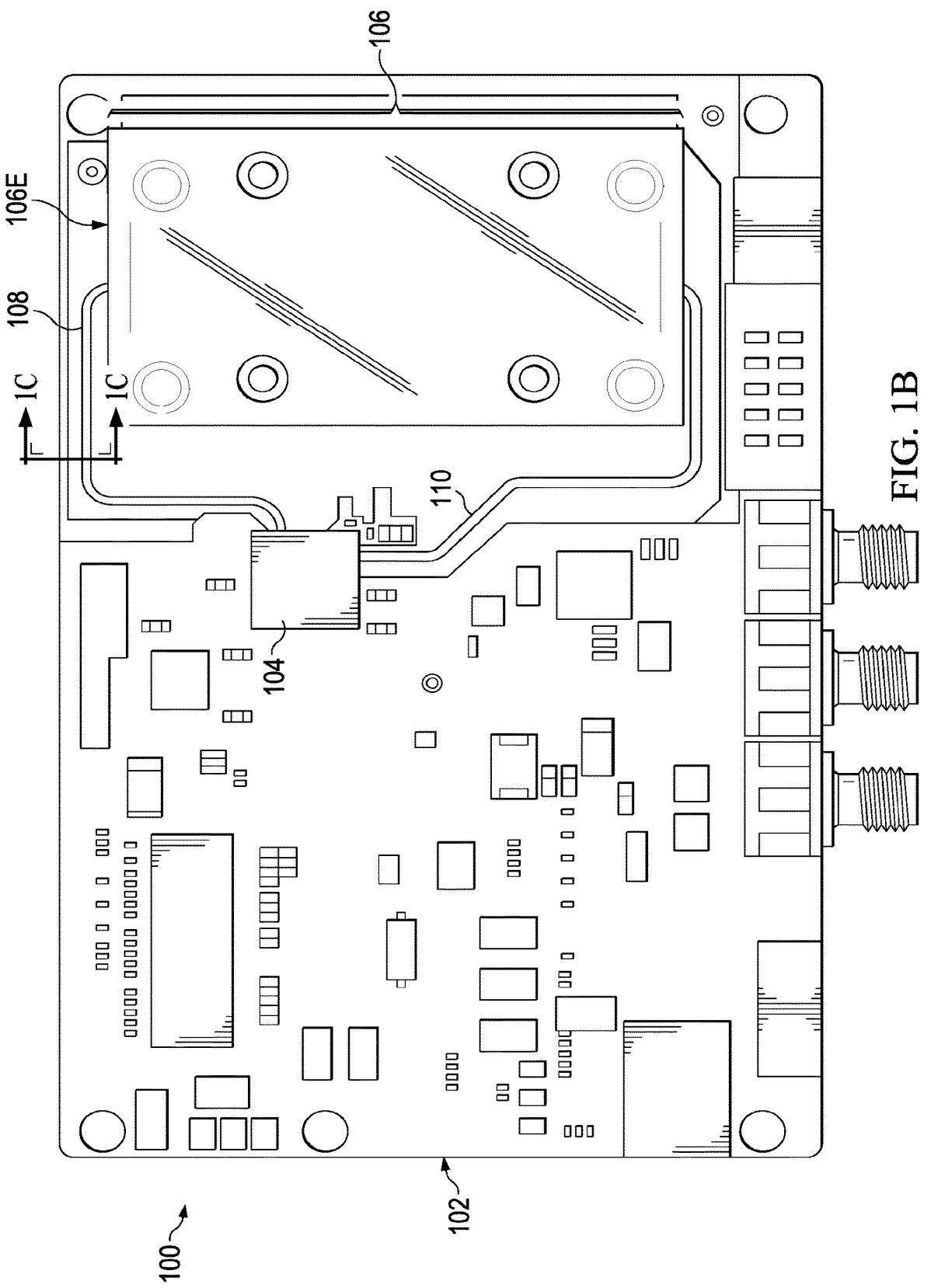
FIG. 1B illustrates the system of FIG. 1A, with the addition of its transceiver coupled to an atomic clock cell assembly.
Figure 1C:
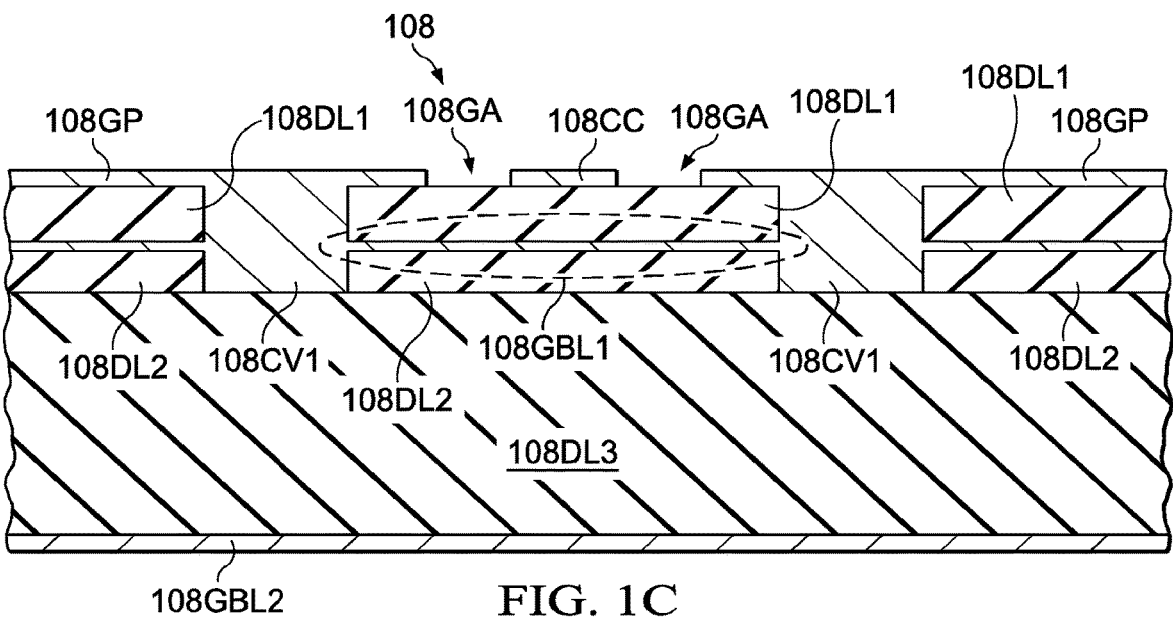
FIG. 1C illustrates a cross-sectional view of coplanar waveguide of the system of FIG. 1A.

FIGS. 1A through 1C illustrate various views of an example embodiment compact molecular clock system 100. Specifically, FIG. 1A illustrates a plan view of a substrate 102, such as a printed circuit board (PCB), to which additional items are added to form the molecular clock system. Substrate 102 is rectangular by way of example with dimensions length (L) by width (W), where by way of example L may be 3 to 4 inches, and W may be 2 to 3 inches. Substrate 102 physically supports various electrical/electronic elements and also facilitates electrical connectivity between various of those elements. Thus, various blocks and electrical traces are shown generically as examples. Substrate 102 also may include many layers, such as in the case of a multilayer PCB stackup.

FIG. 1B illustrates system 100 of FIG. 1A, which includes a transceiver 104 coupled to an atomic clock cell assembly 106. Transceiver 104 is, for example, an integrated circuit operable to transmit and receive signals. As one example, transceiver 104 is an integrated circuit radar, such as the AWR1642 which is commercially available from Texas Instruments Incorporated. The AWR1642 is a self-contained frequency-modulated continuous wave radar (FMCW) sensor with radar sensors in the band of 76 to 81 GHz. The AWR1642 includes one or more processors (e.g., digital signal processor) and supports multiple transmit and receive radar channels, radio configuration, control, calibration, and programming of model changes for enabling a wide variety of sensor implementations. FMCW is just one approach as an example, and other embodiments are contemplated with alternative transmission/modulation schemes employed by transceiver 104. Accordingly, and as detailed below, transceiver 104 is coupled to communicate with radar waveguides between transceiver 104 and atomic clock cell assembly 106.

The radar waveguides between transceiver 104 and atomic clock cell assembly 106 may be achieved, for example, by coplanar waveguides shown generally at 108 and 110. One coplanar waveguide 108 may transmit a wave from transceiver 104, via a first antenna 112 (FIG. 1A), to cell assembly 106, and another coplanar waveguide 110 may receive a wave from cell assembly 106 and communicate it, via a second antenna 114 (also, FIG. 1A), to transceiver 104. While the current illustration provides a single transmit waveguide and a single receive waveguide, plural of such waveguides are also contemplated. Indeed, two transmit and two receive waveguides may be used with axi-symmetric complementary devices so as to accommodate PCB or other configuration constraints. In any event, coplanar waveguide 108 (and 110) may, as an example, be formed, plated, or etched on a surface or within a layer of substrate 102. By way of example, FIG. 1C illustrates a partial cross-sectional view of coplanar waveguide 108. Accordingly, the FIG. 1C illustration provides context for the term "coplanar" as waveguide 108 includes a center conductor 108CC, formed by example as a microstrip. Coplanar with center conductor 108CC is a ground plane 108GP, which is a metallic layer that is partially atop, along with center conductor 108CC, a dielectric layer 108DL1, leaving gaps 108GA between the outer edges of center conductor 108CC and ground plane 108GP. As known in the art, waveguide 108 is well-suited to propagate, and maintain most of the electromagnetic wave energy, along center conductor 108CC.

Waveguide 108 also may use conductive vias 108CV1 to extend downward from ground plane 108GP, to connect to one or more common grounded buried layers, as follows. A first grounded buried layer 108GBL1 is shown as the thin portion of conductive material between dielectric layer 108DL1 and a second dielectric layer 108DL2, thereby forming a grounded coplanar waveguide, which is often more desirable for wave communication, albeit requiring the additional structure to accomplish the common ground. A second grounded buried layer 108GBL2 is spaced apart from layer 108GBL1 by a dielectric layer 108DL3, which is thicker than dielectric layer 108DL2. As further discussed below in connection with FIG. 2B, a portion of dielectric layer 108DL3, and of second grounded buried layer 108GBL2, extends below first antenna 112 or second antenna 114 (FIG. 1A), whereby those portions provide a reflector to guide waves through the respective antennas and confine the energy from dissipating laterally. Lastly and returning to FIGS. 1A and 1B, note that as waveguides 108 and 110 approach assembly 106, each turns in a direction that is approximately orthogonal relative to a respective flat edge 106E of assembly 106, whereupon each waveguide 108 and 110 may enter into a respective recess formed on the backside of an interposer (see, a recess 204R on backside of an interposer 204 in FIG. 2A), where each recess is formed from a respective edge 106E to a respective one of first antenna 112 or second antenna 114 on substrate 102, which desirably reduces cross-talk.

Figure 2A:
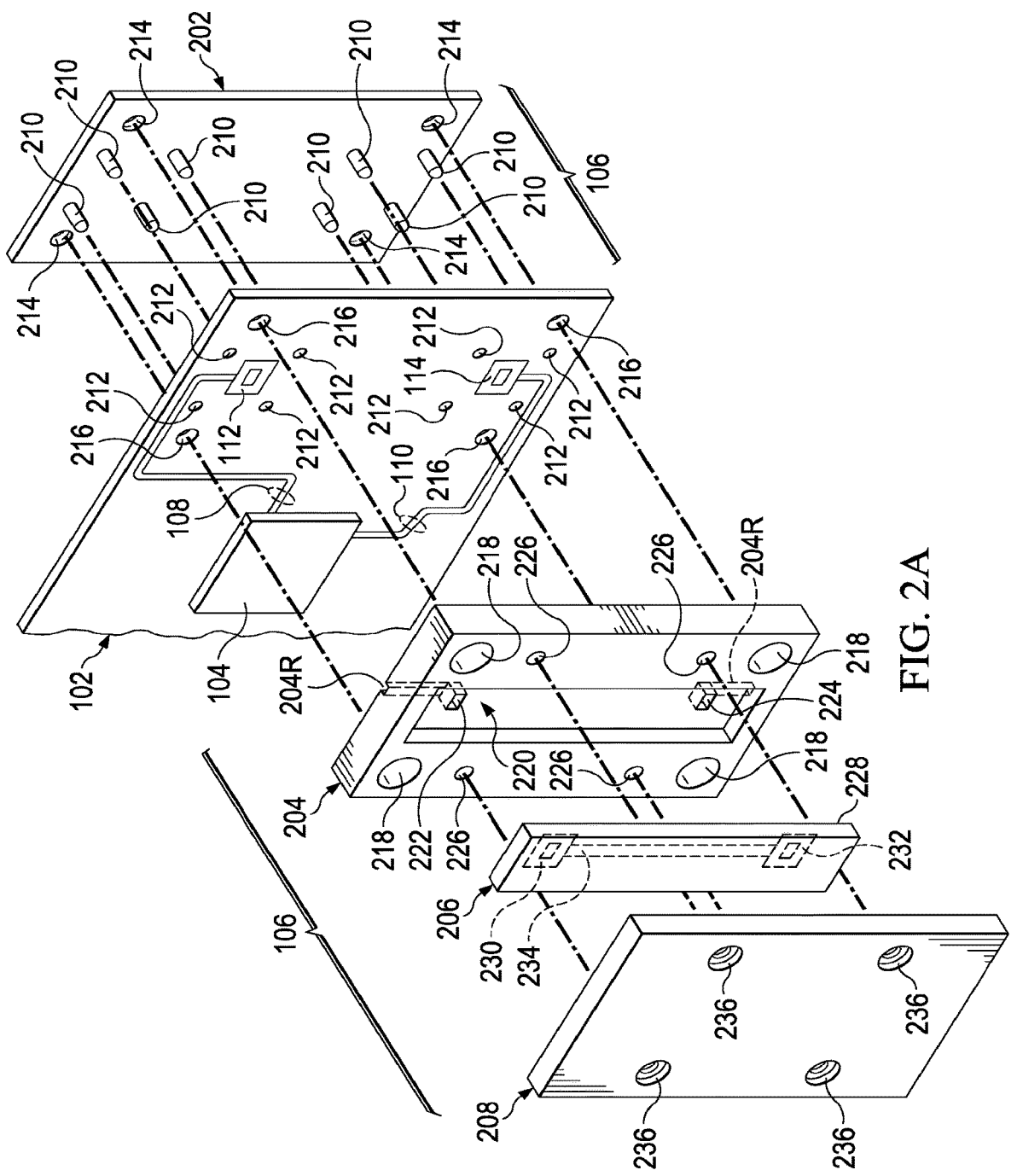
FIG. 2A is an exploded view of the gas cell assembly of FIG. 1.

FIG. 2A is an exploded view of assembly 106, relative to a portion of substrate 102, and referring thereto atomic clock cell assembly 106 is now described. In an example embodiment, assembly 106 includes four items, namely, a back plate 202, an interposer 204, an atomic gas cell 206, and a top plate 208, all of which are positioned relative to substrate 102. Each of these items is further described below.

Back plate 202 may be metal, and it is positioned on one side (e.g., bottom) of substrate 102. For fitment of back plate 202 relative to substrate 102, back plate 202 includes one or more alignment pins 210 that fit through respective apertures 212 in substrate 102. For reasons described below, back plate 202 also includes four (e.g., threaded) apertures 214, one such aperture near each of its corners. When back plate 202 is affixed to substrate 102, each of the apertures 214 aligns with a respective aperture 216 through substrate 102.

Interposer 204 may be made of metal, such as copper, aluminum, or made of plastic or polymer and subsequently plated with copper, silver or gold, and preferably is of high conductivity, whereas by contrast back plate 202 and top plate 208 do not necessarily comprise high conductivity materials. Interposer 204 is positioned on a side (e.g., top) of substrate 102 opposite the side at which back plate 202 is positioned. In an example embodiment, the alignment pins 210 of the back plate 202 extend not only into apertures 212 in substrate 102, but also through substrate 102 so that the tips of those pins 210 fit within respective apertures on the surface of interposer 204 that contacts the substrate 102 (but that surface is not visible in the perspective of FIG. 2A). Further, once interposer 204 is positioned against substrate 102, four fasteners (e.g., screws, not shown) are affixed through four respective countersunk apertures 218 in interposer 204, through respective apertures 216 in substrate 102, and affix (e.g., threadably, pressure fit) within respective apertures 214 in back plate 202. Accordingly, these fasteners ensure a retaining compressive force, and an established or enforced alignment of interposer 204 relative to substrate 102, by affixing back plate 202 and interposer 204, with substrate 102 compressed therebetween. Further with respect to interposer 204, it also includes a cavity 220, for example generally parallelepiped in shape, and as detailed below to receive gas cell 206 to enforce alignment between the waveguide and the physics cell launches. A first rectangular aperture 222 is proximate a first end of cavity 220, and a second rectangular aperture 224 is proximate a second end of cavity 220, where each of rectangular apertures 222 and 224 extend from cavity 220 through the remainder of the metal material of interposer 204. In this regard, when interposer 204 is affixed to substrate 102, a portion of coplanar waveguide 108 becomes located between interposer 204 and substrate 102 and that portion aligns within a recess 204R along the backside of interposer 204. Further, rectangular aperture 222 of interposer 204 aligns with first antenna 112, which is connected to waveguide 108. Similarly when interposer 204 is affixed to substrate 102, a portion of coplanar waveguide 110 becomes located between interposer 204 and substrate 102 and that portion aligns within another recess (not shown) along the backside of interposer 204, relative to rectangular aperture 224. Further, rectangular aperture 224 aligns with second antenna 114, which is connected to waveguide 110.

First and second antennas 112 and 114 were introduced earlier, but as may be now better appreciated, are formed, for example, as metal couplers with an outside shape to generally match that of rectangular apertures 222 and 224. In the illustrated example, therefore, for each antenna 112 and 114, an outer rectangular metal shape is provided with a center opening, such as concentrically located within each rectangle. These antennas 112 and 114 or coupling structures are designed to maintain a continuous geometrical structure and thereby minimize both impedance mismatch and the insertion loss to the aperture 222 and 224 and in this way efficiently conduct the signal to and from gas cell 206. The dimensions (and shaping) may be designed so as to communicate wave signals as further described later, for example according to the frequency band of the signals. In the examples provided, the shaping provides "rectangular waveguide" (RW) structures for guiding electromagnetic waves although not necessarily limited thereto, where such structures are also sometimes referred to as transmission lines. Lastly and for reasons described below, interposer 204 also includes four threaded apertures 226 on its surface that faces away from substrate 102, where preferably each of these threaded apertures 226 does not extend fully through the thickness of interposer 204.

Cell 206 includes a sealed interior in which a gas is stored. More specifically, cell 206 stores a dipolar gas, such as water vapor or any other dipolar molecular gas, inside an enclosed cavity of the cell, the cavity being sealed by nature of shapes, layering, and the like that combine to enclose the dipolar gas at a relatively low (e.g., 0.1 mbar) pressure. A particular dipolar gas is preferably selected based on a frequency range of interest. For example, with transceiver 104 providing a frequency range of 76 to 81 GHz, an appropriate dipolar gas may be HCN, DCN, OCS, H2O, CH3CN etc. Additionally, cell 206 may be formed in connection with an integrated circuit wafer, which can include multiple layers affixed relative to a semiconductor substrate (see, e.g., the incorporated by reference U.S. Pat. No. 9,529,334). Preferably, the outer perimeter of cell 206 is shaped to fit in abutment with the inner walls/shape of cavity 220 of interposer 204. Accordingly, once interposer 204 (and back plate 202) is fixed relative to substrate 102, cavity 220 in essence provides a receptacle in which cell 206 may be located, and later removed/replaced if desired or necessary. Further with respect to cell 206 and such alignment, the bottom surface 228 of cell 206, that aligns with the bottom of cavity 220, is not visible from the perspective of FIG. 2A. As shown in dotted lines, however, that bottom surface 228 includes a first rectangular antenna transition 230 that, when cell 206 is within cavity 220, aligns and is in wave communication with, aperture 222, so that antenna transition 230 functions as a wave launch; similarly, bottom surface 228 includes a second rectangular antenna transition 232 that, when cell 206 is within cavity 220, aligns and is in wave communication with, aperture 224, so that antenna transition 232 also functions as a wave launch. A waveguide 234 is formed between transitions 230 and 232, which may be formed by the shape and/or material of the cell cavity, further enhanced by the inclusion of metal along one or more of the surfaces of the cell cavity, an example of which is described below.

Figure 2B:
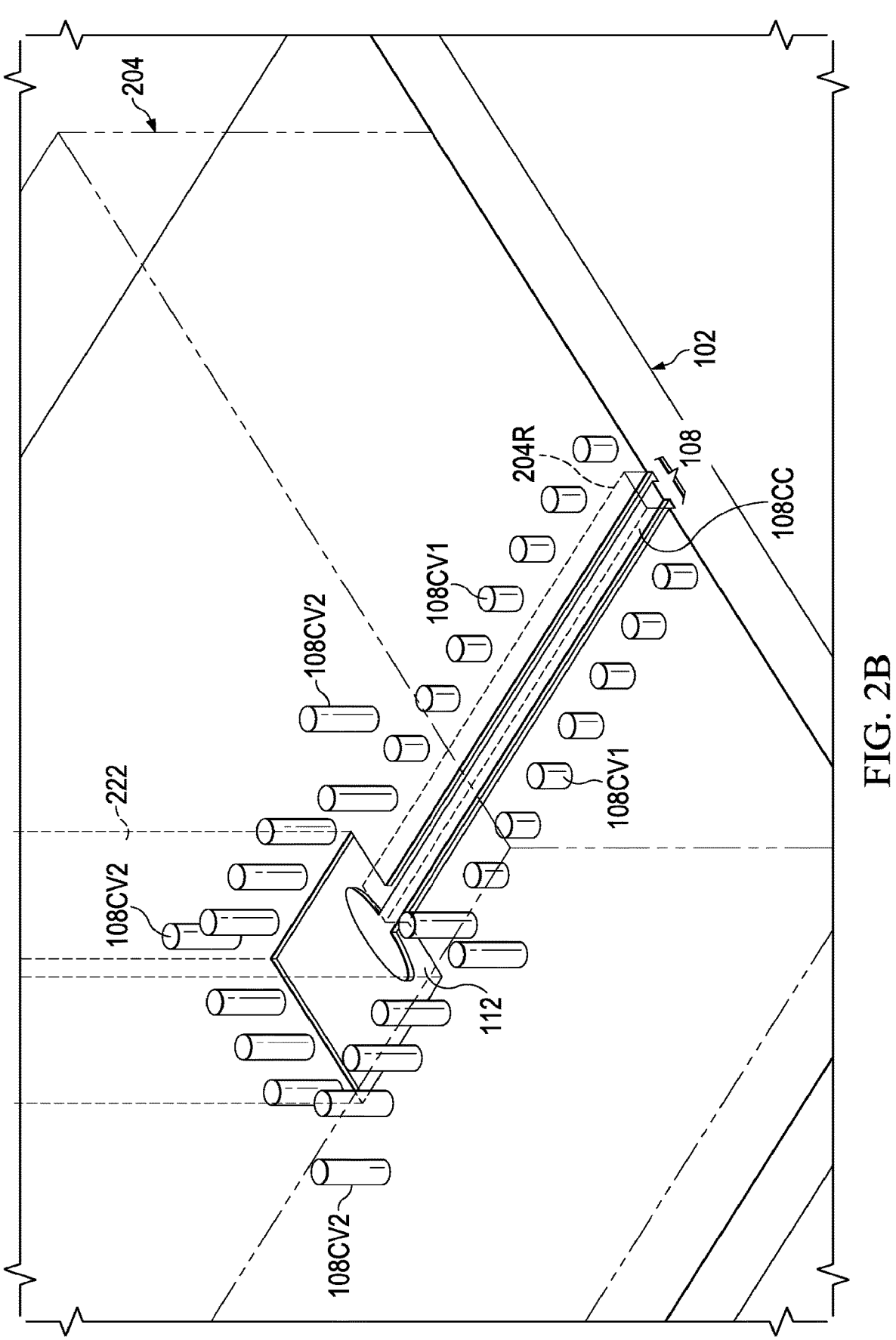
FIG. 2B is a perspective view of portions of a wave path through various example embodiment structure.

Having illustrated and described a wave communication path between substrate 102 and cell 206, through interposer 204, FIG. 2B illustrates a perspective view of portions of that path. In FIG. 2B, certain reference numbers introduced earlier are repeated. Accordingly, interposer 204 is adjacent substrate 102, and a portion of coplanar waveguide 108 is show on substrate 102 and passes into recess 204R of interposer 204. Along the sides of coplanar waveguide 108 are positioned a number of approximately evenly-spaced conductive vias 108CV1. Coplanar waveguide 108 ends at antenna 112, which is shown aligned with rectangular aperture 222 of interposer 204. While not shown, beneath antenna 112 there is an opening, for example rectangular, through grounded buried layer 108GBL1 (FIG. 1C) so that reflections from second grounded buried layer 108GBL2 (FIG. 1C) may reach antenna 112, through dielectric layer 108DL3 (FIG. 1C). Around the outer perimeter of antenna 112 are conducive vias 108CV2, which are longer than conductive vias 108CV1, as conducive vias 108VC2 extended deeper into the layers of substrate 102 so as to reach grounded buried layer 108GBL2 (FIG. 1C). In this way, that grounded buried layer 108GBL2, and dielectric layer 108DL3 (FIG. 1C) above it, facilitate the above-described reflector functionality with respect to a wave traveling along coplanar waveguide 108 and within aperture 222.

Figure 3:
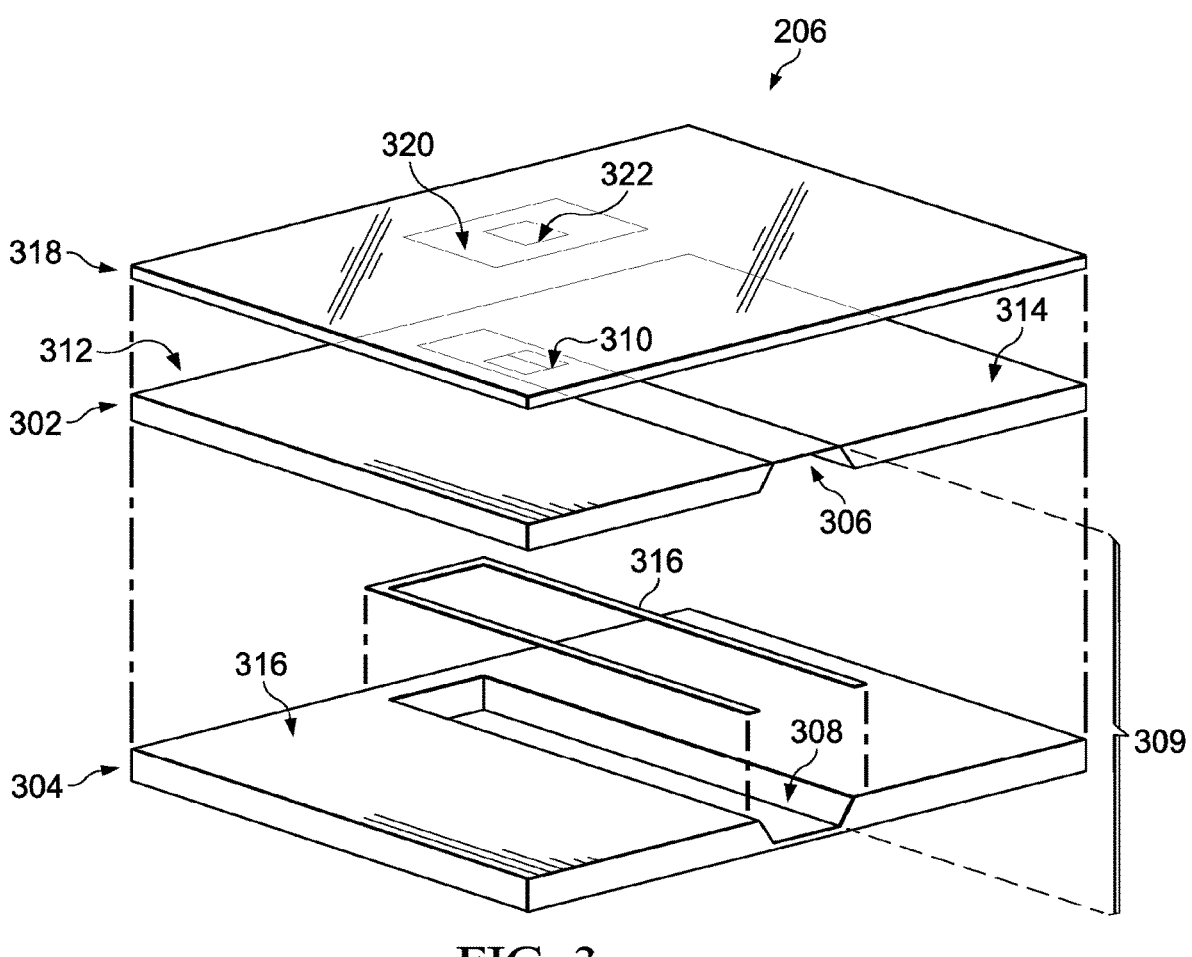
FIG. 3 is an exploded view of a portion of the gas cell of FIG. 2A.

FIG. 3 is an exploded partial view of an example construction of one end of cell 206, with it understood that the other end is comparably constructed. Cell 206 is preferably formed from two like-dimensioned (e.g., same thickness) semiconductor wafer layers 302 and 304. Each wafer layer 302 and 304 may be etched at a same time so as to achieve uniform etch shape and dimensions. In an example embodiment, the wafer layer etch can be achieved using tetramethylammonium hydroxide (TMAH) etching and to form respective trapezoidal cross-section cell cavity regions 306 and 308 along a respective length of layers 302 and 304. Such a shape may be desirable for interfacing with the TI AWR 1642 in E-band. Other cross-sections are also contemplated, including as examples KOH (Potassium Hydroxide), DRIE (Deep Reactive Ion Etching), RIE (Reactive Ion Etching), XeF2 (Xenon difluoride), etc. Also, the etch may be constrained in contemporary processes for smaller dimension etching, and when forming an angle along the etch may, by virtue of the etch process and not necessarily otherwise by specification, fix the trapezoid leg angle at approximately 54.7 degrees. In all events, etch attributes may be selected based on the absorption frequency of the molecule in cell 206. The width and depth of the etched cavity will define the cross-section of the "metallic waveguide" formed when all sides of the cavities are metallized later on in the process flow. The dimensions of the metallic waveguide will define a cut-off frequency below which there will be no electromagnetic waveguide propagation, as well as an upper cut-off frequency, which are common knowledge. Then, the dimensions of the cavity should be designed such that the quantum transition to be interrogated in the cell is at least 10 GHz above this cut-off frequency to ensure a good electromagnetic signal propagation. For example, a transceiver/interposer/cell at 73 GHz is roughly twice the size of the same set of structures to interrogate the same molecule at 182 GHz. Examples of other such structures may be found in co-owned U.S. Pat. Nos. 9,529,334 and 10,131,115, and co-owned U.S. patent application publications US2019/0074233 and US2019/0071306A1, all of which are hereby incorporated fully herein by reference. In the present example, using such an etch in a single wafer would cause the bottom of the etch (the base width of the trapezoid at the depth of the etch) to be considerably shorter than the top of the etch (the base width of the etch at the upper surface of the wafer). However, in an example embodiment, by etching two wafers 302 and 304 and then combining them as described below, the etch limitations only apply to each wafer, at a shorter total depth. In other words, by way of example, each wafer 302 and 304 is etched to a depth of 0.7 mm, with a resulting bottom base edge approximately 2 mm long and a top base edge approximately 3.1 mm; when wafers 302 and 304 are therefore subsequently faced to one another as shown in FIG. 3, the resultant cavity 309 comprising cavity regions 306 and 308 will have a hexagonal cross-sectional shape with a total height of approximately 1.4 mm; to the contrary, were a single trapezoid etch performed in a single wafer to form the cavity, the fixed trapezoid leg angle of the TMAH etch would result in a shorter bottom (e.g., 1 mm or less), which may be less desirable as the cavity subsequently performs its waveguide functionality. While cavity 309 is shown by example as hexagonal, alternative embodiments are contemplated in which cavity 309 has a cross-section that provides a circular waveguide and/or a circular polarized propagation mode.

Additional aspects with respect to the layering of cell 206 are also shown in FIG. 3, as now described. With respect to layer 302, in addition to the above-described trapezoidal etch, an aperture 310 is formed proximate one end of cavity region 306 and from cavity region 306 to a surface 312 of layer 302. Aperture 310, therefore, forms an electromagnetic wave passageway for one of the two above-described rectangular antenna transitions 230 and 232, while similarly, but not shown in the partial view of FIG. 3, a comparable second aperture is formed proximate an opposite end of cavity region 306, so as to form an electromagnetic wave passageway for the other of the two above-described rectangular antenna transitions 230 and 232. Surface 312 is also metalized to form a metalized layer 314, as may be achieved using known processes. Thereafter, cavity 306 is positioned to face cavity 308, with a bonding ring 316 between layers 302 and 304 and preferably positioned just beyond the outer boundary of cavity regions 306 and 308. Bonding ring 316 may be a eutectic metal, deposited for example by sputtering, e-beam evaporation, or electroplating, and used to assist with bonding wafers 302 and 304 together, thereby creating a singular cavity 309 from cavity regions 306 and 308. Also, while not shown, either or both of cavity regions 306 and 308 may be treated, lined, coated, or otherwise processed to include additional aspects, such as conductive or dielectric layering, to facilitate or improve the interior of cavity 309 as a signal waveguide and to minimize surface reactivity to the gas contained in the cavity or to prevent outgassing from the sidewalls into the cavity. Thus, the waveguide will communicate a wave along the created, singular cavity 309, from aperture 310 at one end of the cavity to the other aperture at the other end of the cavity (not shown, but represented in FIG. 2A as associated with one of transitions 230 and 232).

Completing the illustration of FIG. 3, cell 206 also may include a glass sheet 318 and a metal coupling ring 320. Glass sheet 318 has generally the same outer dimensions as layers 302 and 304, and may be 200 to 300 microns thick, by way of example. Glass sheet 318 provides a plane on which can be patterned antennas on its top surface so as to permit the launch of the wave signal into cavity 309. Selection of glass as a material for this plane (for glass sheet 318) may be desirable as glass provides a dielectric constant of around 4 to 5, permitting the stated thickness of 200-300 microns. To the contrary, for example, if silicon were used, it would provide a dielectric constant of 13, implying a layer thickness well below 100 microns, which will make the mechanical construction much more complicated. Indeed, such a thin membrane may fail to hold the pressure differential between the inside and the outside of the cell. Other materials that are matched, in terms of coefficient of thermal expansion, with silicon and that provide low dielectric constant are also candidates for layer 318. Metal coupling ring 320 is affixed to glass sheet 318, at a position to align with aperture 310, and is described as a ring in that it presents a metal structure with a central aperture 322, where again both the surrounding metal and the aperture 322 are rectangular, consistent with the other rectangular waveguides herein.

Returning to FIG. 2A and having detailed cell 206 in connection with FIG. 3, the placement of the glass sheet 318 side of cell 206 into cavity 220 of interposer 204 completes a wave path between antennas 112 and 114. By way of example, therefore, transceiver 104 may transmit a wave along waveguide 108, along a first dimension parallel to substrate 102, to antenna 112 as a transmit antenna. From antenna 112, the wave will continue, but in a second dimension differing from the first dimension (i.e., not parallel to substrate 102), where in the example of FIG. 2A this second dimension is perpendicular (or approximately perpendicular, such as 90±10 degrees) to the first dimension. In the illustrated example, the second dimension guides the wave through the air medium inside first rectangular aperture 222 of interposer 204, as a rectangular waveguide, further through central aperture 322 of metal coupling ring 320 (FIG. 3), glass sheet 318, and aperture 310 proximate one end of cavity region 306, all serving as first rectangular antenna transition 230 and thereby entering the resultant cavity 309 of cell 206. Once the wave travels along that resultant cavity 309 of cell 206, it will interrogate atoms of the dipolar gas inside the cell will respond based on the frequency of the interrogating wave. Thus, the wave will continue along cavity 309 and then exit from a comparable central aperture (not shown), pass again in the second dimension through glass sheet 318, and then another metal coupling ring (not shown), all serving as second rectangular antenna transition 232, from where the wave will continue through the air medium inside second rectangular aperture 224 of interposer 204, also as a rectangular waveguide, to antenna 114. Once the wave reaches antenna 114, it may be communicated, in the first dimension, by paired trances 110 to transceiver 104. As a result, transceiver 104 may evaluate the received signal response and, for example in comparison to the energy of the transmitted wave signal, make various determinations, such as whether (or when) the frequency of the excitation wave matches the rotational quantum transition frequency of the dipole gas in the cell.

Completing FIG. 2A, top plate 208 is secured atop a portion or all of cell 206 by affixing to plate 208 to interposer 204. More specifically, once top plate 208 is positioned against atop cell 206 and adjacent interposer 204, four fasteners (e.g., screws, not shown) are affixed through four respective countersunk apertures 236 in top plate 208 and affix (e.g., threadably) within respective apertures 226 in interposer 204. Accordingly, these fasteners ensure a compressive force, and established alignment and retention, between cell 206 and interposer 204.

From the preceding, system 100 provides a compact millimeter wave system in which an interposer provides a wave path directly to a PCB launch, where the interposer includes another waveguide, such as a standard WR structure, for example a WR-12 flange. As a result, a gas cell can be easily and quickly tested by locating it within the interposer using standard lab instrumentation, without the need for wafer probing directly to the PCB launch. This is a potentially considerable benefit, as the alternative of wafer probe, especially at millimeter wave geometry, is costly, tedious, and has significant repeatability challenges. Conversely, example embodiments facilitate affixing (e.g., screwing) pieces together with much less risk to both the part and the instrumentation. And, an assembled physics cell/interposer can be quickly tested without critical microscope optical alignment and then be then readily assembled to the millimeter wave transceiver PCB. Still further, in the example millimeter wave clock example described, it may use an already-existing transceiver 104 (e.g., TI AWR 1642), located on a substrate 102 (e.g., PCB) away from the clock gas cell 206. The system 100 further includes: (i) a transmit and receive waveguide 108, 110 affixed to (e.g., atop; within) the substrate 102, extending between the transceiver 104 and ends of the gas cell 206; and (ii) two additional waveguides 222, 224, each extending away from a respective one of the paired waveguides, and in a dimension other than that of the paired waveguide (e.g., perpendicular), to an end of the gas cell. Numerous other aspects also have been shown in connection with system 100. For example, from the wave path just described, the wave may enter the cell, travel through it, and again return, via the second dimension, to the dimension of another pair of waveguides and back to the transceiver. As another example, the cell may be positioned in a receptacle, where the receptacle is rigidly affixed relative to antennas on a substrate so as to reduce potential signal loss as the wave propagates, particularly as it passes through media of different impedance. Moreover, the inventive scope includes various other example embodiments, which may be separately considered within the present scope and from which selected features of different embodiments may be combined to form still other example embodiments, as will be understood by one skilled in the art from the remaining discussion.

Further from the preceding, various of the preceding inventive teachings, as well as other that follow, may be applied to other millimeter wave systems. Specifically, typical testing may be achieved by either mechanical, hand, and/or machine-guided or implemented probing. Often in this context, a substrate (e.g., PCB) has printed guidelines on the substrate akin to crosshairs, and test probe alignment may be aligned to the guidelines while attempting to use a (sometimes crude) microscope, with sufficient magnification (e.g., 250 times) so that the probe tip may be observed while bringing it into contact with a proper landing point. Sometimes multiple probes are so moved at once, requiring proper and concurrent guidance of each probe to a respective landing point and a same time, with little room for error. And, the efforts must be repeated for both the transmit and receive millimeter wave paths. Unsurprisingly, such an approach is very time intensive and prone to error. In contrast, example embodiments provide an interposer affixed to the millimeter wave communicating substrate and having waveguides corresponding to target locations on the substrate, whereby the interposer is thusly aligned with respect to those target locations that otherwise would, in the prior art, require the above-noted probing. Accordingly, the interposer provides a testing mechanism already aligned relative to the millimeter wave path item to be tested. In the examples provided herein, therefore, interposer 204 provides an affixed cavity 220 already aligned to millimeter wave communication points represented by first antenna 112 and second antenna 114. Hence, further testing, or millimeter wave communication, need not be directly to those communication points, but instead may be made via the interposer. In the example of a millimeter wave clock, therefore, interposer 204 serves as an already-aligned receptacle in which atomic gas cell 206 may be located with far less complexity and time than would be required to precisely align it with, and affix it directly to, first antenna 112 and second antenna 114.

Figure 4A:
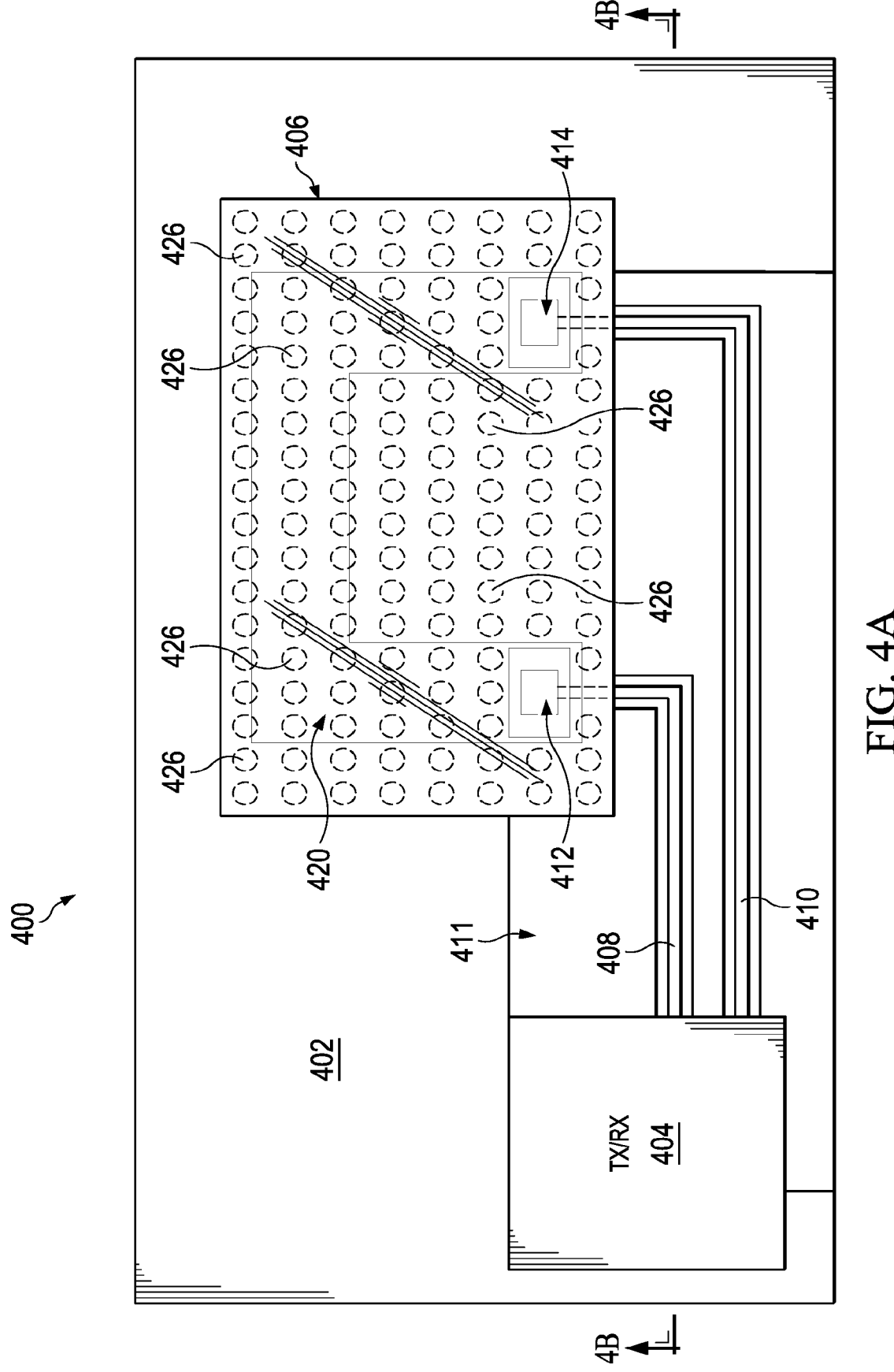
FIG. 4A is a plan view.
Figure 4B:
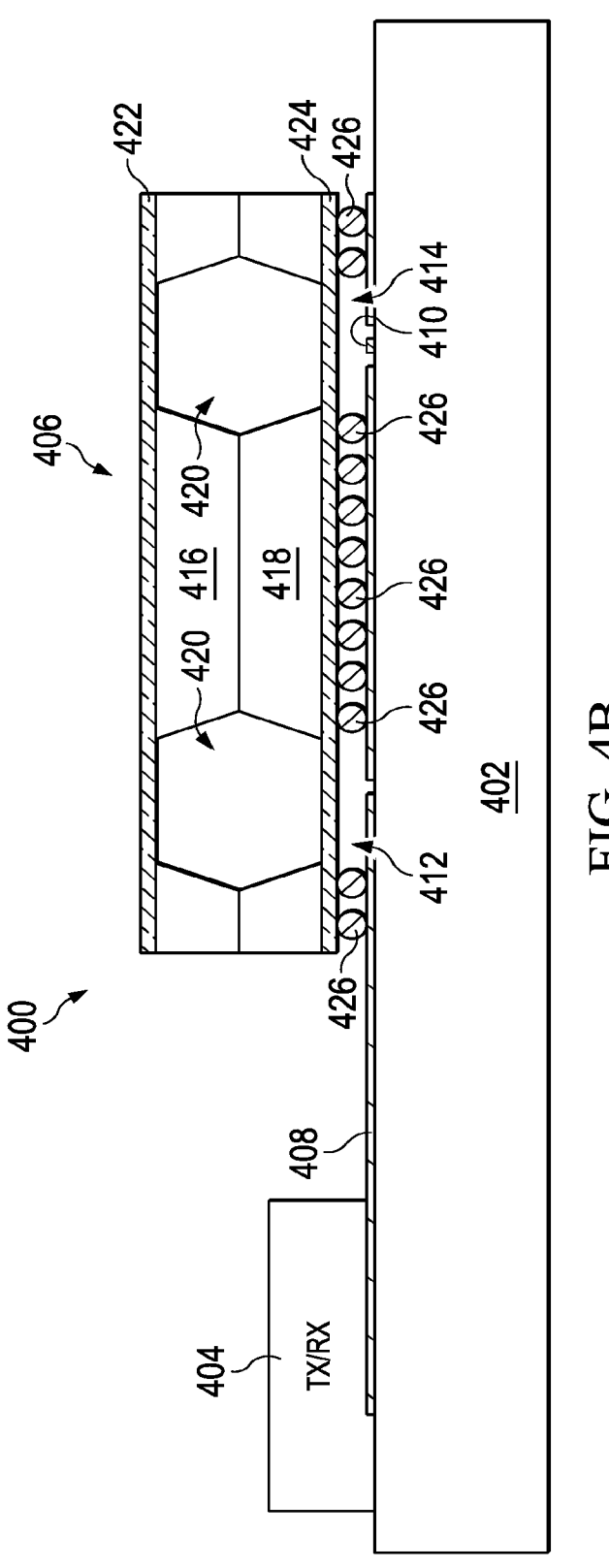
FIG. 4B is a cross-sectional view, of an alternative compact molecular clock system.

FIG. 4A is a plan view, and FIG. 4B is a cross-sectional view, of an alternative compact molecular clock system 400. System 400 includes a substrate 402 (e.g., PCB or the like) and a transceiver 404 affixed to substrate 402. Transceiver 404 can electrically communicate with other apparatus fixed relative to substrate 402. Such communications include between transceiver 404 and an atomic clock cell 406, by coplanar waveguides shown generally at 408 and 410. In the illustrated embodiment, waveguides 408 and 410 may be formed by etching appropriate paths, preferably in a same plane, from a metallic layer 411 that is located on or in substrate 402. Waveguide 408 may communicate with a first antenna area 412 and waveguide 410 may communicate with a second antenna area 414.

Certain aspects of system 400 differ from system 100 of FIGS. 1A through 3. For example, cell 406 again includes two semiconductor wafers 416 and 418, each with a respective trapezoidal cavity, faced and affixed to one another to form a continuous resultant cavity 420, where in this example embodiment cavity 420 has a partial serpentine path that perpendicularly changes direction twice as the wave propagates between first antenna area 412 and second antenna area 414. Additionally, cell 406 includes both an upper glass layer 422 and a lower glass layer 424, and cell 406 is not enclosed in a receptacle apparatus. Instead, cell 406 is electrically (and physically) connected and coupled to substrate 402 by a group of, preferably symmetrically located, conductive affixation members 426, which in the illustrated example embodiment are solder balls. In the example of FIGS. 4A and 4B, the group of conductive affixation members also may be arranged generally in row/column orientation, thereby forming a ball grid array (BGA) or copper studs or bumps between lower glass layer 424 and a surface of substrate 402. Conductive affixation members 426 (e.g., solder balls), however, are not present in the first antenna area 412 and second antenna area 414 (or in the path of waveguides 408 and 410). As a result, the absence of a conductor in those areas, and the surrounding conductors around the perimeter of those areas as best seen in FIG. 4A, form a metallic waveguide from the antenna areas 412 and 414, vertically in FIG. 4B, upward through lower glass layer 424. Accordingly, for example, a wave may travel from a transmit channel of transceiver 404, through waveguide 408 to first antenna area 412, upward in air and through lower glass layer 424 and into cell 406 and through its serpentine path, while then exiting cell 406 again through lower glass layer 424, through air to second antenna area 414, and then through waveguide 410 to a receive channel of transceiver 404. Lastly, in this example embodiment (and others), if the various waveguide structure path is dimensioned at least one order smaller than the wavelength of the wave being guided, then the wave effectively "sees" the communication path as a continuous conductor, that is, with relatively small signal loss along the wave path. Accordingly, in various example embodiments, the wave path structure is such that at least in the vicinity of antenna areas 412 and 414, the spacing of conductive affixation members 426 provide a passageway that is the wave wavelength/10, or smaller. However, over the remainder of substrate 402, spacing of affixation members 426 may vary or be determined by the mechanical design considerations for thermal stress.

Figure 5A:
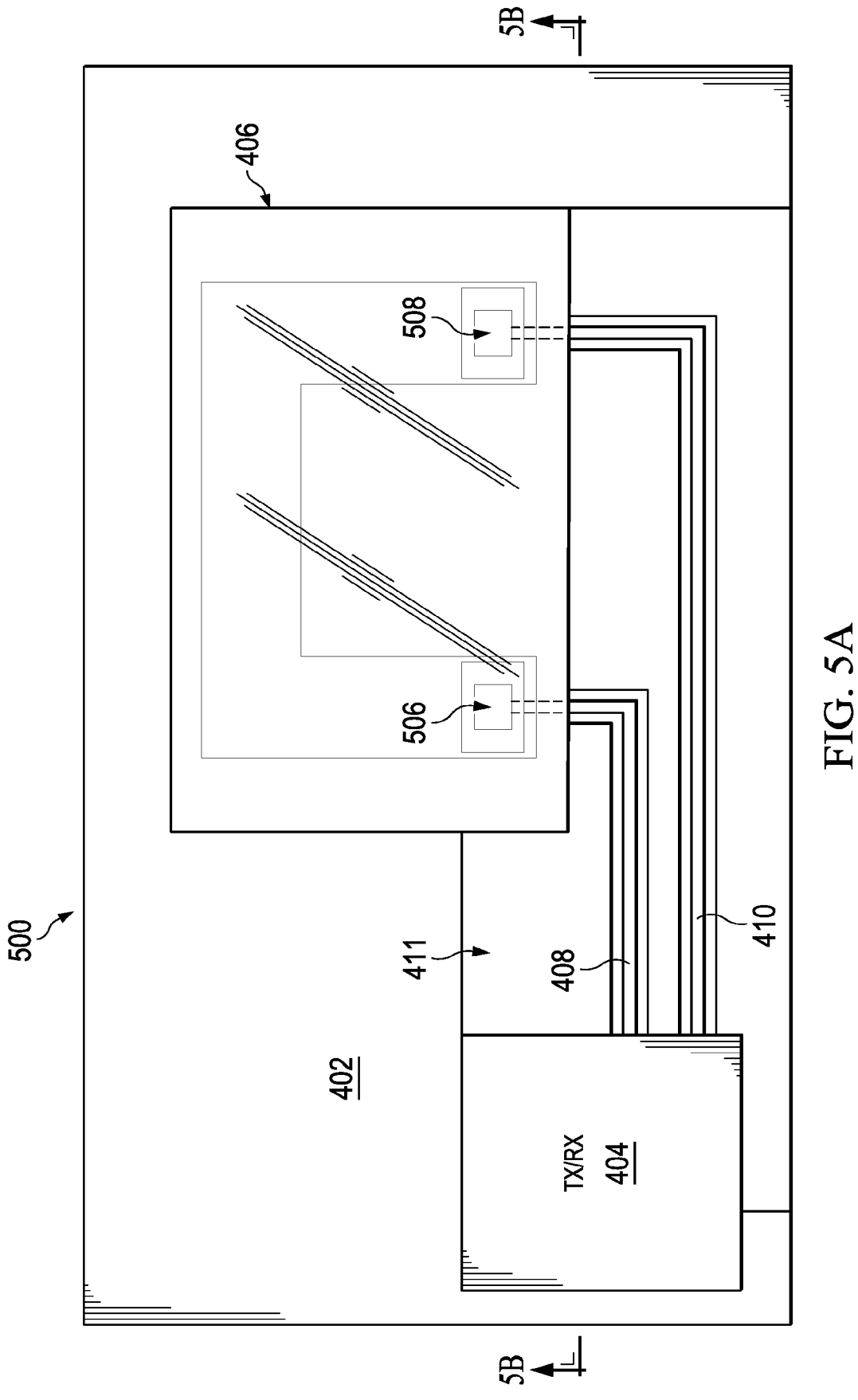
FIG. 5A is a plan view.
Figure 5B:
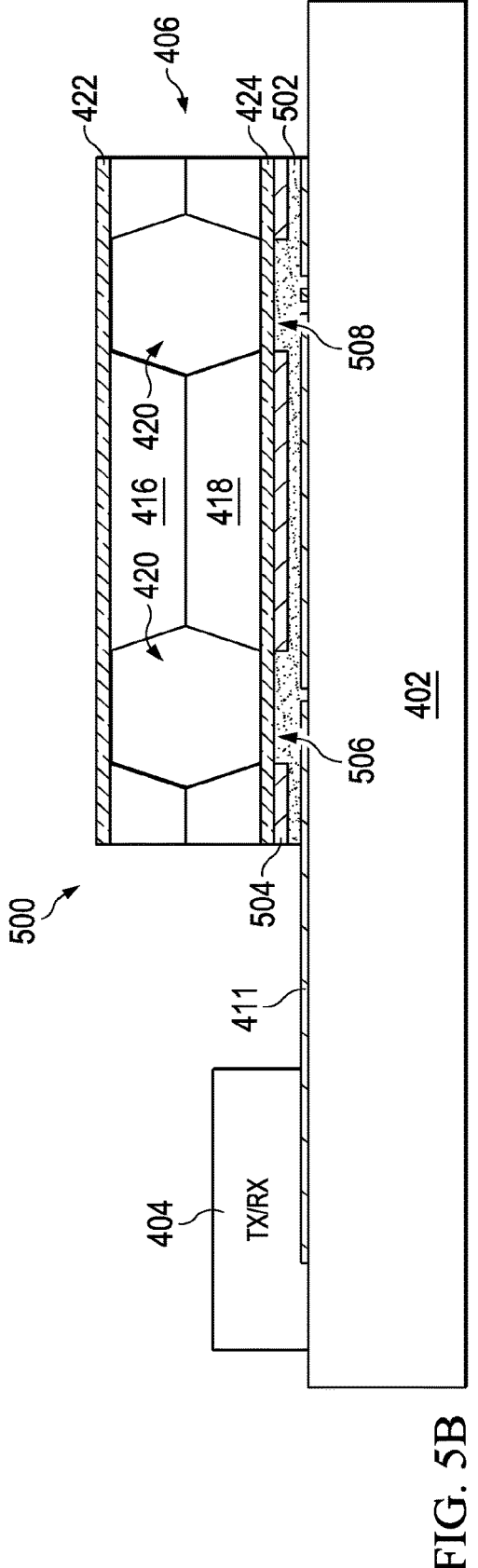
FIG. 5B is a cross-sectional view, of an alternative compact molecular clock system.
Figure 5C:
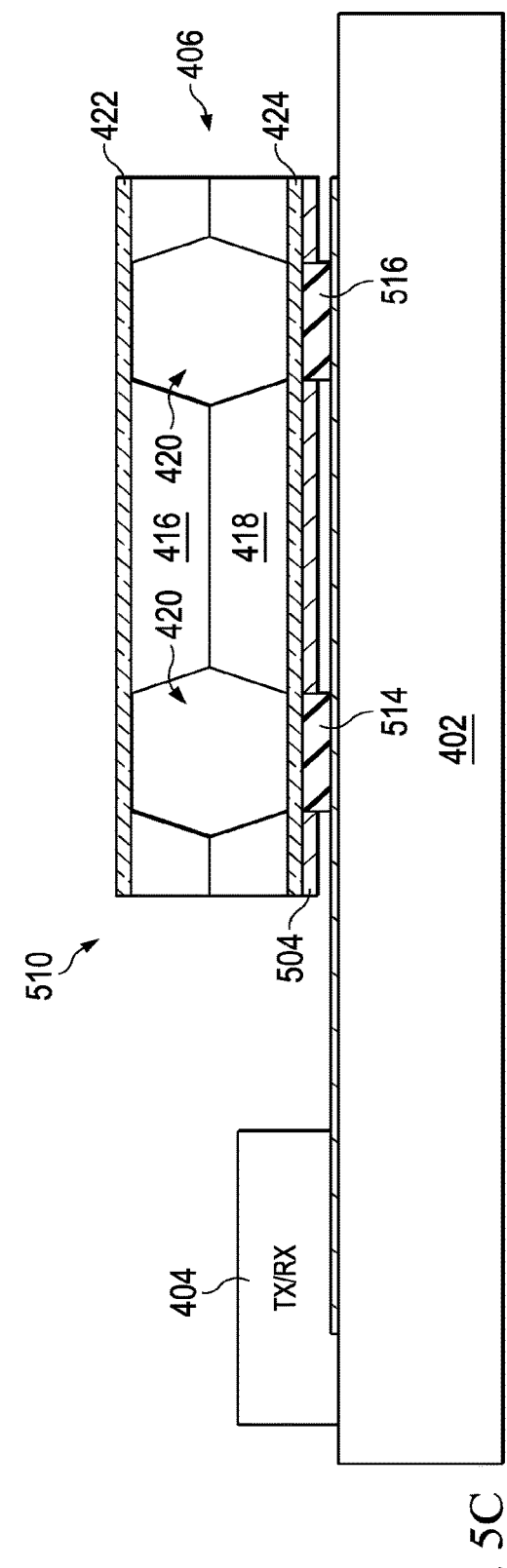
FIG. 5C is a cross-sectional view of an alternative compact molecular clock system.

FIG. 5A is a plan view, and FIG. 5B is a cross-sectional view, of an alternative compact molecular clock system 500. System 500 includes various of the same members and connectivity of system 400 in FIGS. 4A and 4B, so for such items like reference numbers are carried forward from system 400 to system 500. For system 500, however, a layer of glue 502 (with favorable dielectric constant and loss tangent) is used to affix cell 406 relative to substrate 402, as opposed to conductive affixation members. Further, a metalized layer 504 is formed outside of lower glass layer 424, as may be achieved as a metalized layer akin to layer 314 of FIG. 3; here, however, openings (e.g., by evaporation and patterning) are made in metalized layer 504 to allow wave passage through the openings so as to create a first antenna area 506 and a second antenna area 508 and to create an electronic band gap structure (EBG) for wave communication, again consistent with earlier teachings. Thus, a wave may pass from one waveguide 408 in the area of first antenna area 412, through the medium of glue 502 and lower glass layer 424 and entering into cell 406, as guided by a first opening in metalized layer 504. The wave then continues through cell 406, and it then exits from an opposite end of cell 406 by passing through lower glass layer 424 and the medium of glue 502, as guided by a second opening in metalized layer 504 in the area of second antenna 508, continuing then to waveguide 410. Further, in an example embodiment, the thickness of glue 502 is sufficiently thin so as to prevent metalized layer 504 and metallic layer 411 from acting as a parallel plate waveguide in order to prevent unwanted cross-talk or signal loss FIG. 5C illustrates an alternative cross-sectional view to compact molecular clock system 500 of FIG. 5 and, accordingly, in FIG. 5C the system is shown as system 510. Again, where comparable items exist in FIG. 5C from an earlier Figure(s), the same reference number(s) is carried forward. System 510 replaces the glue layer 502 of FIG. 5B with sections 514 and 516 of high dielectric constant polymer. In system 510, therefore, the wave path is through the high dielectric constant polymer sections 514 and 516 rather than glue (e.g., FIG. 5B) or air (e.g., FIG. 4B), as may be more favorable for certain implementations. Indeed, by having a high dielectric constant polymer sections 514 and 516, just in the antenna area, the transfer of energy between the antenna to the gas cell is increased or maximized. In other words, insertion loss can be substantially improved because the electromagnetic waves would prefer to concentrate in the high dielectric regions and minimize the propagation between TX and RX, reducing cross talk. While cross talk may be mitigated with other techniques (e.g., EBG for narrow band between TX and RX), the use of low loss, high dielectric constant polymer placed in the area of the antennas greatly assists against a parallel plate electromagnetic mode that otherwise could be excited and increase TX/RX cross talk. Lastly, the thickness of polymer sections 514 and 516 are selected according to the wavelength of the guided wave, where preferably that thickness is less than or equal to wavelength/4.

Figure 6:
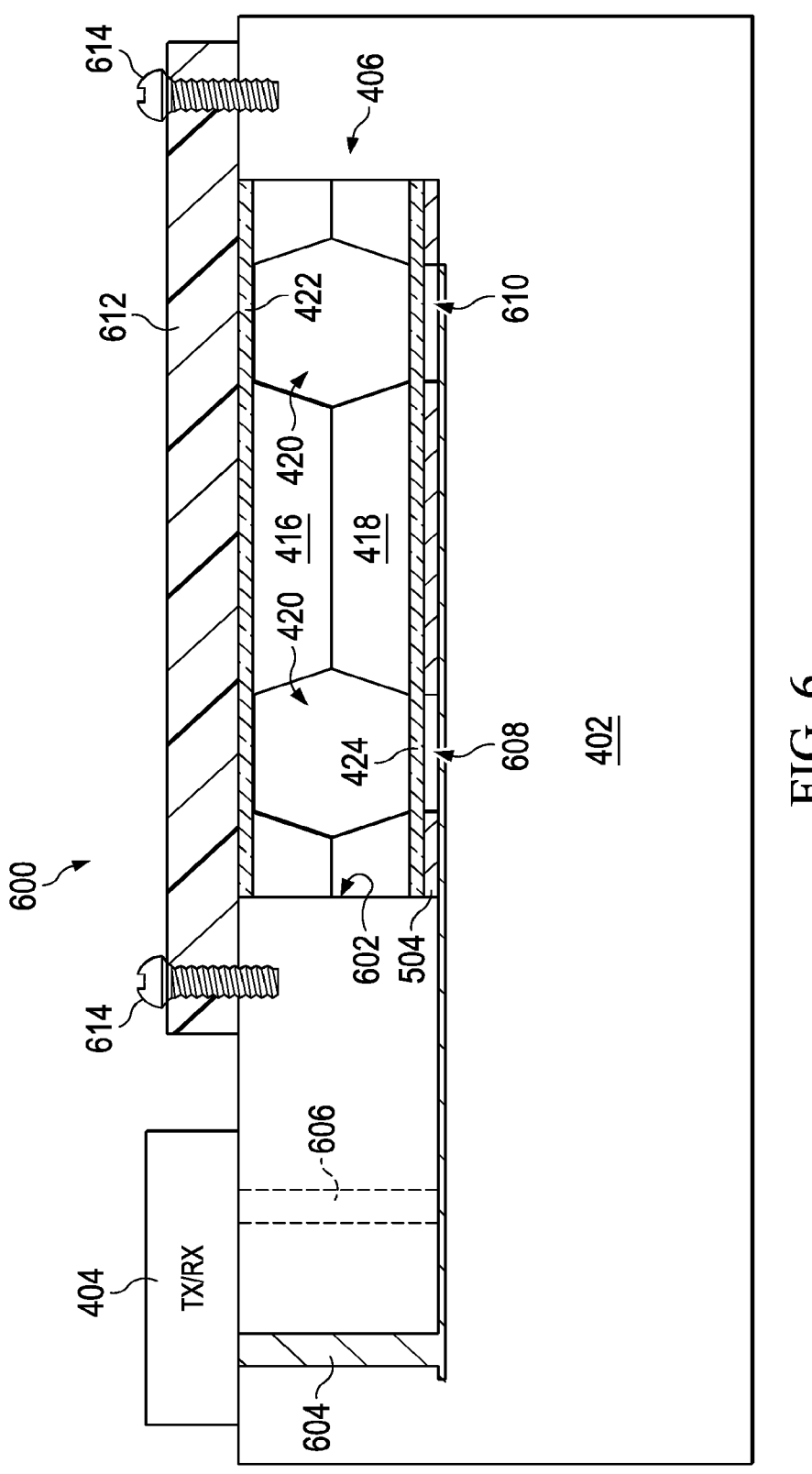
FIG. 6 is a cross-sectional view of an alternative compact molecular clock system.

FIG. 6 illustrates a cross-sectional view of another alternative compact molecular clock system 600. Again, where comparable items exist in FIG. 5C from an earlier Figure(s), the same reference number(s) is carried forward. In system 600, a receptacle area 602 is formed as a cavity in substrate 402, thereby forming a receptacle into which cell 406 is positioned. Waveguides 604 and 606 (606 shown with dashed lines, as not visible from the cross section where 604 is visible) extend first vertically and then horizontally (horizontally either co-planar, or not necessarily) between transceiver 404 and receptacle area 602, providing a first antenna area 608 and a second antenna area 610. Accordingly, a wave may be communicated between cell 406 and a respective one of the antenna areas 608 and 610, by passing through a respective aperture in metalized layer 504 as well as lower glass layer 424. For structural retention (and potentially alignment), a cover 612 is also affixed atop either a portion or all of cell 406, as may be further retained by affixation members 614. Indeed, with the retention of cell 406 in this manner, further underlying alignment support is unnecessary and, therefore, the horizontal extension of waveguides 604 and 606 may directly contact metalized layer 504 (that is formed on the exterior surface of lower glass layer 424).

Figure 7A:
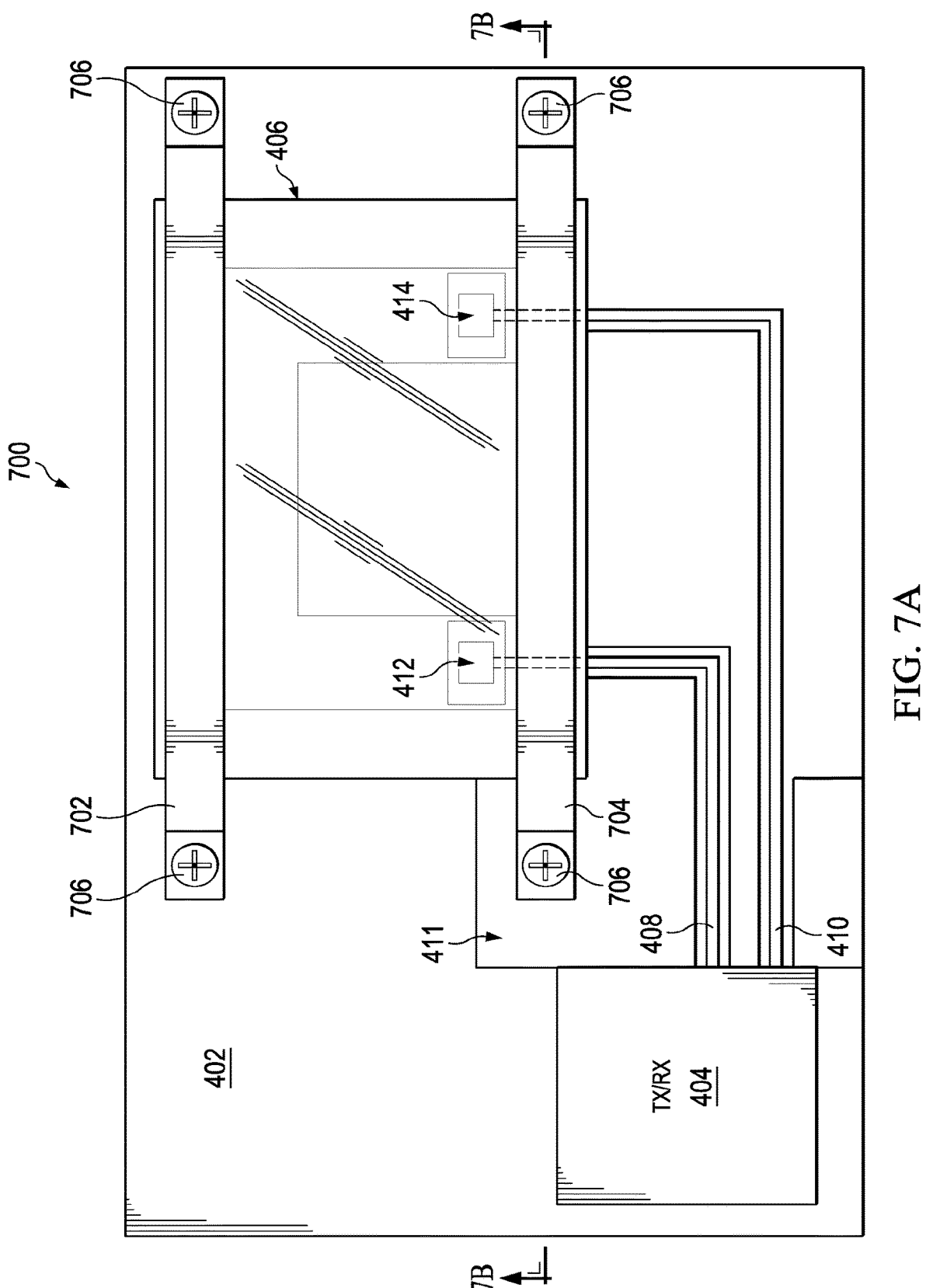
FIG. 7A is a plan view.
Figure 7B:
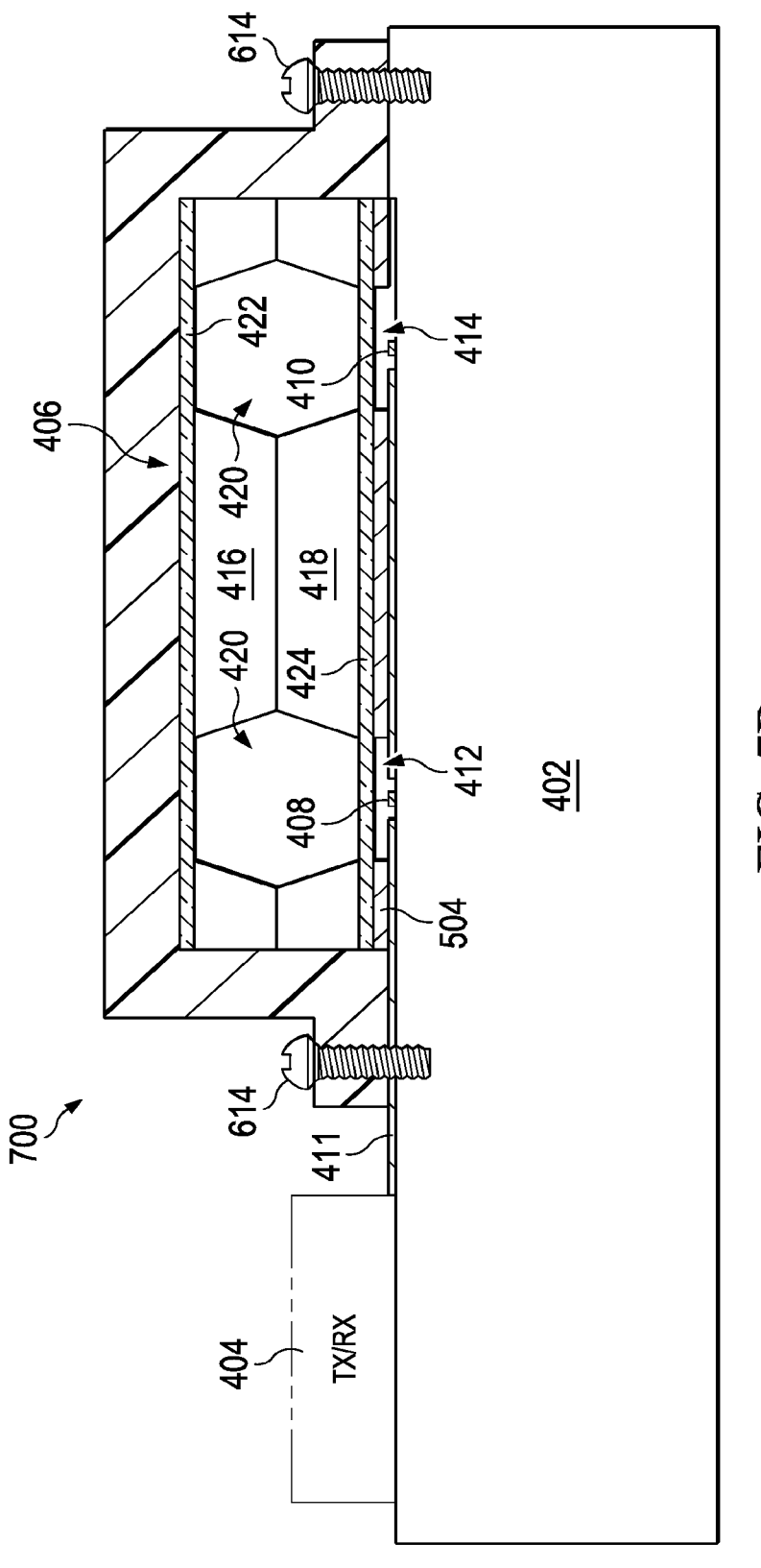
FIG. 7B is a cross-sectional view, of an alternative compact molecular clock system.

FIG. 7A is a plan view, and FIG. 7B is a cross-sectional view, of another alternative compact molecular clock system 700. Again, where comparable items exist in FIGS. 7A and 7B from an earlier Figure(s), the same reference number(s) is carried forward. In system 700, comparable in various respects to system 500 of FIGS. 5A and 5B, cell 406 is positioned above substrate 402. For system 700, however, paired covers 702 and 704 are included atop cell 406, as may be further retained by affixation members 706. Similar to system 600, in system 700 with the physical retention and alignment of cell 406 by a cover or covers 702 and 704, further underlying alignment support is unnecessary and, therefore, the horizontal extension of waveguides 408 and 410 may directly contact metalized layer 504.

Figure 8A:
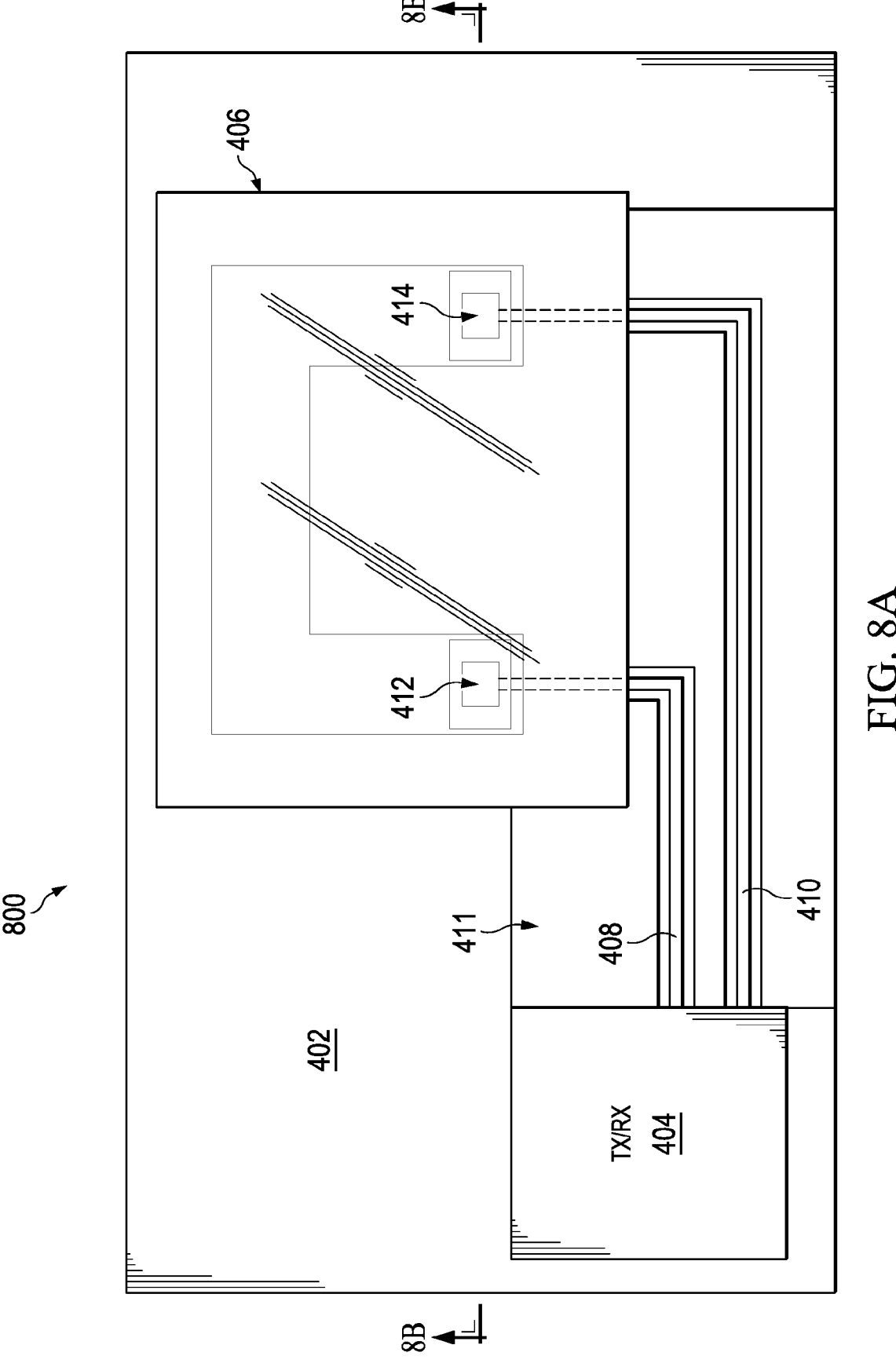
FIG. 8A is a plan view.
Figure 8B:
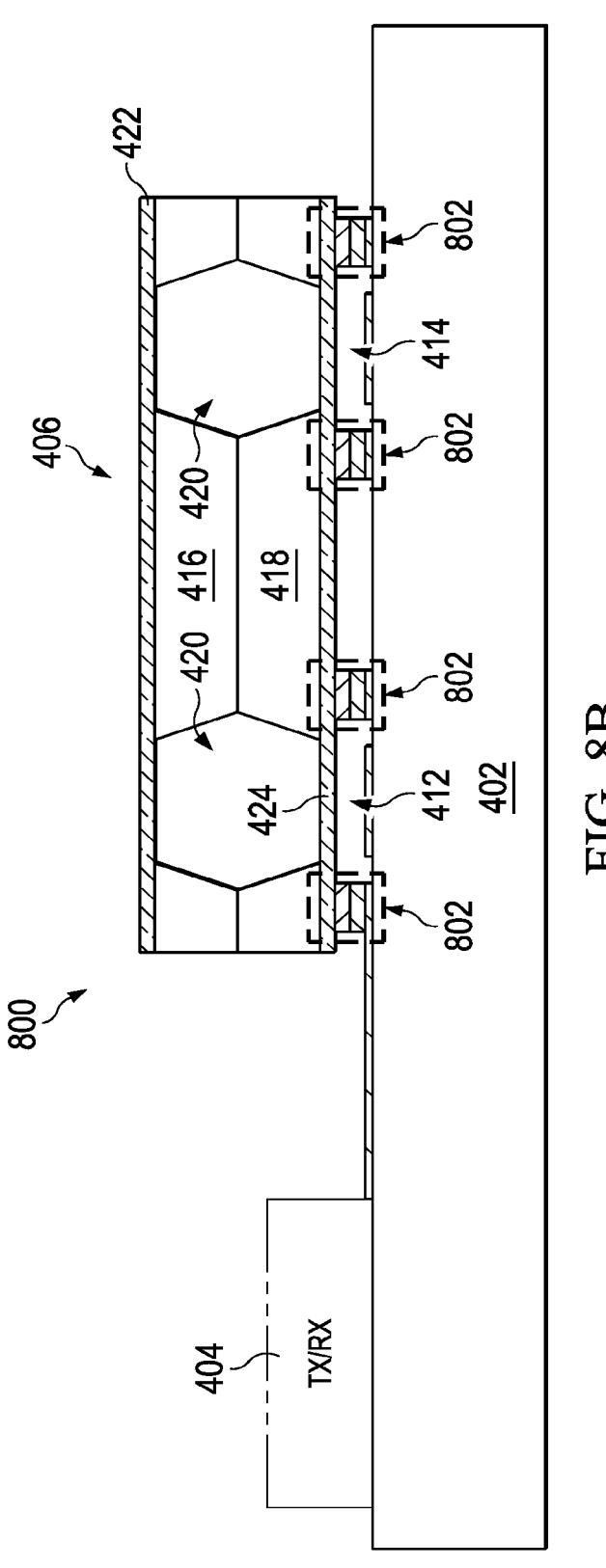
FIG. 8B is a cross-sectional view, of an alternative compact molecular clock system.

FIG. 8A is a plan view, and FIG. 8B is a cross-sectional view, of another alternative compact molecular clock system 800. Again, where comparable items exist in FIGS. 8A and 8B from an earlier Figure(s), the same reference number(s) is carried forward. In system 800, comparable in various respects to system 500 of FIGS. 5A and 5B, cell 406 is positioned above substrate 402. In system 800, however, such positioning is achieved by a land grid array (LGA) connection, which includes a number of solder pads 802 between substrate 402 and glass layer 424. As with FIGS. 4A and 4B, the LGA connections in the vicinity of areas 412 and 414 are spaced to provide a passageway that is the wave wavelength/10, or smaller. Each pad may include a solder paste that is positioned between metal layers, where a first of those metal layers can be the same metallic layer 411 in which the TX/RX waveguides are formed, and a second of those layers can be from portions of the metalized layer 504. The solder paste is subsequently melted, for example during a reflow process, so as to align and affix cell 406 relative to first antenna area 412 and second antenna area 414.

From the above, one skilled in the art should appreciate that numerous example embodiments are provided, each representing a compact molecular clock system. Example embodiment may have various benefits. For example, example embodiments provide appropriate alignment of the atomic gas cell relative to communication antennas, for example to propagate waves through different media, including air, glue, and polymer, while still other propagation media may be included and/or substituted. As another example, some example embodiments permit removal and replacement of the clock cell, while also facilitating alignment within a receptacle, including for example by human hands. As yet another example, alignment is achieved in various manners for differing example embodiments, so as to reduce or minimize signal loss. As a final example, additional modifications are possible in the described embodiments, and other embodiments are possible, within the scope of the claims.

What is claimed is:

1. An apparatus, comprising:
   a substrate;
   an interposer coupled to the substrate at least via fasteners;
   a cell containing at least one of a gas or a vapor on at least part of the interposer;

a first plate on the cell and coupled to the interposer; and a second plate on a first surface of the substrate opposite to the interposer and the first plate, and the second plate is coupled to the substrate.

2. The apparatus of claim 1, wherein the interposer includes first apertures, and the interposer is coupled to the substrate at least via the fasteners within the first apertures.

3. The apparatus of claim 2, wherein the fasteners are first fasteners, the interposer includes second apertures, and the first plate is coupled to the interposer at least via second fasteners within the second apertures.

4. The apparatus of claim 3, wherein at least one of the first apertures or the second apertures include threaded apertures.

5. The apparatus of claim 1, wherein the second plate includes pins that penetrate through first apertures of the substrate and extend into second apertures of the interposer.

6. The apparatus of claim 5, wherein at least one of the first or second plates is made of a non-metal material.

7. The apparatus of claim 5, wherein at least one of the first or second plates is made of a metal.

8. The apparatus of claim 1, wherein the interposer is made of a metal.

9. The apparatus of claim 1, wherein the interposer includes a non-metal material, and the non-metal material is plated with a metal layer.

10. The apparatus of claim 9, wherein the interposer includes at least one of copper, silver, or gold.

11. The apparatus of claim 1, wherein the interposer includes a recess, and the cell is at least partially in the recess.

12. The apparatus of claim 1, further comprising a transceiver at a position relative to the substrate, and the substrate further includes:

first and second signal launches;

a first waveguide coupled between the first signal launch and the transceiver; and a second waveguide coupled between the second signal launch and the transceiver, wherein the interposer includes a first aperture on the first signal launch and a second aperture on the second signal launch.

13. The apparatus of claim 12, wherein the cell includes a third aperture and a fourth aperture, third aperture being on the first aperture, and the fourth aperture being on the second aperture.

14. The apparatus of claim 13, wherein the cell includes a first metal layer around the third aperture and a second metal layer around the fourth aperture.

15. The apparatus of claim 12, wherein the first waveguide includes a first metal strip on a second surface of the substrate, and the second waveguide includes a second metal strip on the second surface.

16. The apparatus of claim 15, wherein the first waveguide includes a first grounded buried layer in the substrate and a first dielectric layer between the first metal strip and the first grounded buried layer; and wherein the second waveguide includes a second grounded buried layer in the substrate and a second dielectric layer between the second metal strip and the second grounded buried layer.

17. The apparatus of claim 16, wherein the apparatus is part of a millimeter wave system.

18. The apparatus of claim 1, wherein the at least one of the vapor or the gas is selected from a set consisting of HCN, DCN, OCS, H2O, and CH3CN.

19. An apparatus, comprising:

a transceiver;

a substrate including:

first and second signal launches;

a first waveguide coupled between the first signal launch and the transceiver; and a second waveguide coupled between the second signal launch and the transceiver;

an interposer coupled to the substrate at least via fasteners, the interposer including a first aperture on the first signal launch and a second aperture on the second signal launch;

a cell containing at least one of a gas or a vapor on at least part of the interposer; and a plate on the cell and coupled to the interposer.

20. An apparatus, comprising:

a substrate;

an interposer coupled to the substrate at least via fasteners;

a cell containing at least one of a gas or a vapor on at least part of the interposer, the at least one of the vapor or the gas being selected from a set consisting of HCN, DCN, OCS, H2O, and CH3CN; and a plate on the cell and coupled to the interposer.

* * * * *